United States Patent
Calvert et al.

(10) Patent No.: US 9,543,066 B2
(45) Date of Patent: Jan. 10, 2017

(54) SUPERCONDUCTING MAGNETS WITH THERMAL RADIATION SHIELDS

(71) Applicant: Siemens PLC, Camberley (GB)

(72) Inventors: Simon James Calvert, Oxfordshire (GB); Marcel Kruip, Oxfordshire (GB); Rodrigo Ormeno, Worcestershire (GB); Michael Simpkins, Buckinghamshire (GB)

(73) Assignee: Siemens PLC, Camberley (GB)

(*) Notice: Subject to any disclaimer, the term of this patent is extended or adjusted under 35 U.S.C. 154(b) by 0 days.

(21) Appl. No.: 15/042,750

(22) Filed: Feb. 12, 2016

(65) Prior Publication Data

US 2016/0172089 A1 Jun. 16, 2016

Related U.S. Application Data

(62) Division of application No. 14/112,605, filed as application No. PCT/EP2012/053977 on Mar. 8, 2012, now Pat. No. 9,293,253.

(30) Foreign Application Priority Data

Apr. 20, 2011 (GB) .................................. 1106660.2

(51) Int. Cl.
| | |
|---|---|
| *H01F 6/00* | (2006.01) |
| *H01F 6/06* | (2006.01) |
| *G01R 33/3815* | (2006.01) |
| *H01F 6/04* | (2006.01) |
| *H01F 41/04* | (2006.01) |
| *G01R 33/38* | (2006.01) |

(52) U.S. Cl.
CPC ............. *H01F 6/06* (2013.01); *G01R 33/3815* (2013.01); *H01F 6/04* (2013.01); *H01F 41/048* (2013.01); *G01R 33/3802* (2013.01)

(58) Field of Classification Search
CPC ................. H01F 6/00; H01F 6/04; H01F 6/06
USPC ....................................................... 335/216
See application file for complete search history.

(56) References Cited

U.S. PATENT DOCUMENTS

| | | | |
|---|---|---|---|
| 4,822,772 A | 4/1989 | Huson | |
| 4,924,198 A | 5/1990 | Laskaris | |
| 5,023,584 A | 6/1991 | Laskaris | |
| 5,179,338 A | 1/1993 | Laskaris et al. | |
| 5,237,300 A | 8/1993 | Ige et al. | |
| 5,333,464 A | 8/1994 | Laskaris et al. | |
| 5,394,130 A * | 2/1995 | Xu ........................... | H01F 6/06 335/216 |
| 5,410,288 A | 4/1995 | Dorri et al. | |

(Continued)

FOREIGN PATENT DOCUMENTS

| | | |
|---|---|---|
| DE | 3900725 A1 | 7/1990 |
| EP | 1 522 867 A2 | 4/2005 |

(Continued)

*Primary Examiner* — Alexander Talpalatski
(74) *Attorney, Agent, or Firm* — Schiff Hardin LLP

(57) ABSTRACT

A cylindrical superconducting magnet has a number of axially-aligned annular coils of superconducting wire, arranged for cooling by thermal conduction through a cooled surface in mechanical contact with the coils. The coils are provided with a cryogenic radiation shield located between respective radially inner surfaces of the coils and respective axes of the coils. The cryogenic radiation shield is formed of a metal layer in thermal contact with the cooled surface.

7 Claims, 7 Drawing Sheets

(56) References Cited

U.S. PATENT DOCUMENTS

| | | | | |
|---|---|---|---|---|
| 5,530,413 | A * | 6/1996 | Minas | H01F 6/00 324/318 |
| 5,532,663 | A * | 7/1996 | Herd | H01F 6/00 310/52 |
| 5,668,516 | A * | 9/1997 | Xu | G01R 33/3815 324/318 |
| 5,774,032 | A * | 6/1998 | Herd | H01F 6/04 310/52 |
| 5,917,393 | A * | 6/1999 | Kupiszewski | H01F 6/06 174/125.1 |
| 6,192,690 | B1 * | 2/2001 | Stautner | F17C 3/085 62/6 |
| 6,570,476 | B1 | 5/2003 | Laskaris | |
| 6,783,059 | B2 | 8/2004 | Laskaris et al. | |
| 6,864,770 | B2 | 3/2005 | Nemoto et al. | |
| 7,053,740 | B1 * | 5/2006 | Laskaris | G01R 33/3815 324/319 |
| 7,319,327 | B2 | 1/2008 | Ryan et al. | |
| 7,705,701 | B2 * | 4/2010 | Huang | G01R 33/3815 324/200 |
| 7,849,587 | B2 | 12/2010 | Calvert et al. | |
| 7,961,067 | B2 | 6/2011 | Chiba et al. | |
| 8,970,337 | B2 | 3/2015 | Dunckley et al. | |
| 2006/0236709 | A1 * | 10/2006 | Steinmeyer | H01F 6/04 62/259.2 |
| 2006/0266053 | A1 | 11/2006 | Jiang et al. | |
| 2007/0159173 | A1 | 7/2007 | Dietz et al. | |
| 2008/0197850 | A1 | 8/2008 | Dietz et al. | |
| 2010/0102908 | A1 | 4/2010 | Wang | |
| 2012/0075045 | A1 * | 3/2012 | Calvert | H01F 6/04 335/216 |

FOREIGN PATENT DOCUMENTS

| | | |
|---|---|---|
| GB | 1389675 A | 4/1975 |
| GB | 2426630 A | 11/2006 |
| GB | 2432259 A | 5/2007 |
| GB | 2471882 A | 1/2011 |
| JP | 56142607 A | 11/1981 |
| JP | 62013010 A | 1/1987 |
| JP | H04106373 A | 4/1992 |
| JP | 2001015324 A | 1/2001 |
| JP | 2004079304 A | 3/2004 |
| JP | 2005279187 A | 10/2005 |
| JP | 2005335137 A | 12/2005 |
| JP | 2010097919 A | 4/2010 |

* cited by examiner

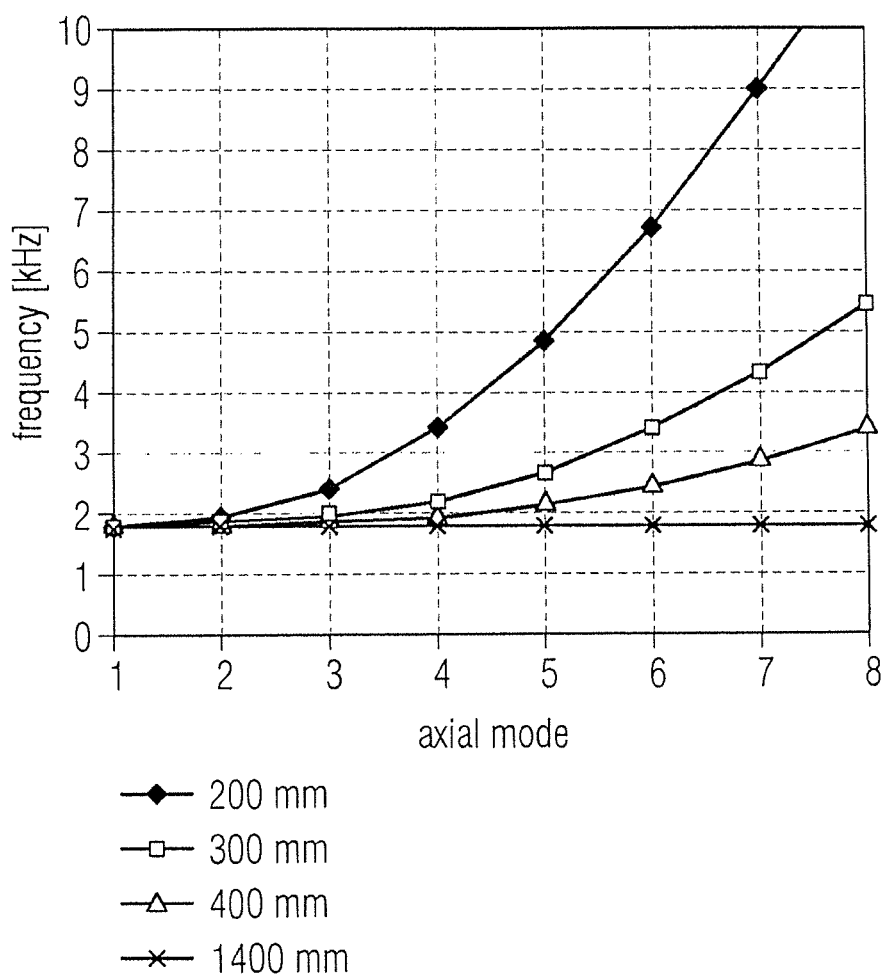

SUPERCONDUCTING MAGNETS WITH THERMAL RADIATION SHIELDS

RELATED APPLICATION

The present application is a divisional application of Ser. No. 14/112,605, having a United States filing date of Oct. 18, 2013, the contents of which are incorporated herein by reference.

BACKGROUND OF THE INVENTION

Field of the Invention

The present invention provides radiation shields for cylindrical superconducting magnets comprising a plurality of axially aligned coils of superconducting wire. In particular, the present invention relates to superconducting magnets which are not cooled by immersion in a liquid cryogen, but are arranged for cooling by thermal conduction through a cooled surface in mechanical contact with the coils.

Description of the Prior Art

Cylindrical superconducting magnets are commonly employed in magnetic resonance imaging (MRI) systems. A strong, homogeneous background magnetic field is provided by the superconducting magnets, and a gradient coil assembly is typically provided inside the bore of the superconducting magnet, and generates rapidly-varying magnetic field gradients in three orthogonal dimensions.

The superconducting magnet is cooled to cryogenic temperatures, and it is conventional for the magnet to be housed inside a hollow cylindrical outer vacuum chamber (OVC), and for one or more hollow cylindrical thermal radiation shields to be positioned between the superconducting magnet and the OVC. Typically, the thermal radiation shield, or the outer thermal radiation shield if there is more than one, is cooled to a temperature of approximately 50K. The assembly therefore comprises at least two closely-stacked cylindrical tubes within the bore of the magnet.

The time-varying currents applied to the gradient coils during an MRI imaging sequence interact with the homogeneous background magnetic field to cause Lorentz forces to act on the gradient coils, resulting in vibration of the gradient coil assembly.

The time-varying magnetic fields generated by the gradient coils induce eddy currents in the material of nearby conductive surfaces, such as bore tubes of the OVC and the thermal radiation shield(s). These eddy currents, flowing through the resistive material of the bore tubes, cause heating which may risk magnet quench due to a rise in coil temperature. Little heat energy is required to cause a quench, due to the very low heat capacity of solid materials at 4K, a typical temperature of operation of cylindrical superconducting magnets.

Furthermore, the eddy currents induced in the conductive bore tubes will interact with the homogeneous background magnetic field to cause Lorenz forces to act on the bore tubes, resulting in vibration of the bore tubes. These vibrations interact with the homogeneous background magnetic field and cause further (secondary) eddy current generation within the bore tubes, in turn causing heating and inducing further (tertiary) eddy currents in neighboring conductive surfaces through generation of secondary magnetic fields. The tertiary eddy currents will in turn produce tertiary magnetic fields. In addition to the unwelcome heating already described, the vibrations cause unpleasant noise for patients placed within the bore of the magnet for imaging.

The eddy currents produced in the material of the OVC bore tube will help to shield the bore tube of the thermal radiation shield stray magnetic fields from the gradient coils.

In a liquid cryogen bath cooled magnet, the liquid cryogen such as helium provides adequate cooling of the coils to prevent a quench happening as a result of eddy currents. However, more recent designs of superconducting magnets do not have coils cooled by immersion in liquid cryogen. Rather, the coils are arranged for cooling by thermal conduction through a cooled surface in mechanical contact with the coils. The cooling may be provided with a cryogen-filled thermosiphon, or by a cryogenic refrigerator thermally linked to the cooled surface. In such low-cryogen inventory magnets, the problem of unwanted gradient coil induced heating (GCIH) is urgent because the thermal resistance between the coil and the cooled surface is significantly higher than in the former liquid cryogen cooled magnets.

The following patent publications relate generally to gradient coil interaction and the reduction of noise and vibration: DE 10 2006 000 923 B4; U.S. Pat. No. 7,535,225 B2; JP 2005279187 A; and US 2006/0266053 A1.

SUMMARY OF THE INVENTION

The present invention accordingly addresses the linked problems of providing shielding from stray magnetic fields and shielding from black body radiation from the thermal radiation shield bore tube. The present invention addresses these problems by providing cylindrical superconducting magnets and methods for manufacture thereof as described below.

The present invention may be applied to any dry, or minimum-cryogen magnet, for example, the so called 'A2-bonded magnet', in which resin-impregnated coils are attached by their radially outer surface to a support structure. Other arrangements of magnets, such as various self-supporting resin impregnated structures, may also benefit from the present invention.

BRIEF DESCRIPTION OF THE DRAWINGS

FIG. 3 shows the variation is resonant frequencies of aluminum tubes of various lengths.

DESCRIPTION OF THE PREFERRED EMBODIMENTS

The present invention addresses the problems of providing shielding from stray magnetic fields, and shielding from black body radiation from the thermal radiation shield bore tube, for superconducting magnets having dry or minimum-cryogen inventory cooling arrangements by providing an electrically conductive shield cooled to cryogen temperature and interposed between the coils of the magnet and the bore tube of the conventional thermal radiation shield. In this way, the effects of GCIH, gradient coil induced heating, are shielded from the coils. The conventional radiation shield in a helium-cooled superconducting magnet system is typically cooled to a temperature of about 50K, while the shield of the present invention is cooled to approximately cryogen temperature, for example about 4K. For this reason, and for clarity and brevity of description, the shield of the present invention will be referred to as a "4K shield" in the following description, while the conventional thermal shield will be referred to simply as "thermal shield".

The combination of impregnated coils and their support structure is cooled to cryogenic temperatures, such as about 4K, to enable superconducting operation. The assembly of magnet coils and its support structure will therefore be referred to as the "cold mass" in the following description.

A first series of embodiments is illustrated by FIGS. 1A to 1G(ii), which show examples of a cooled tubular 4K shield mechanically mounted to the cold mass, to shield the magnet from the undesirable effects of GCI.

Figure 1A:
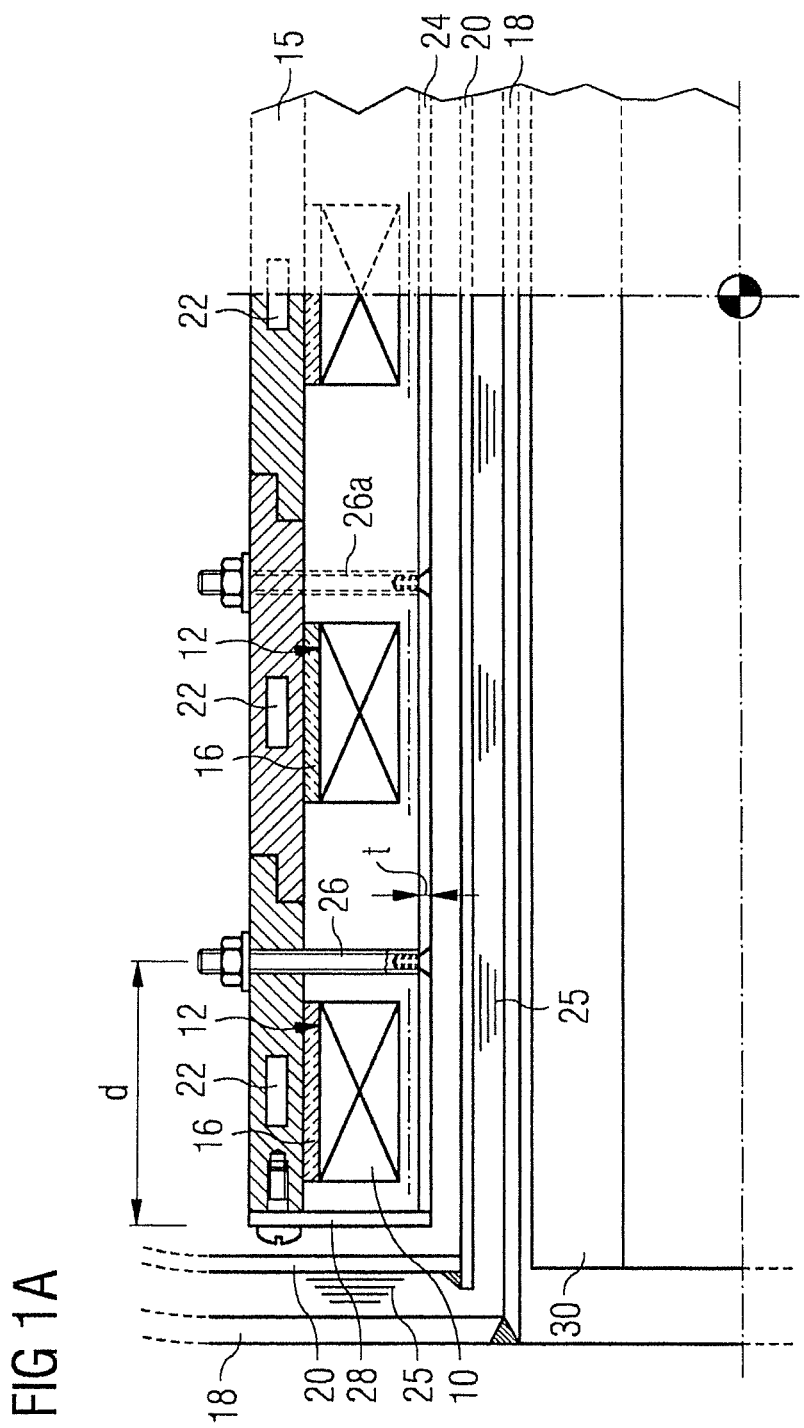
FIGS. 1A to 1G(ii) show several views of one series of embodiments of the present invention.

FIG. 1A shows a partial axial cross section of MRI system including an A2-bonded magnet. Resin-impregnated superconducting coils 10 are bonded by their radially outer surfaces 12 to a tubular support structure 15 of greater diameter than the coils. An electrically isolating filler layer 16 may be interposed between the coils 10 and the support structure 15. In the illustrated arrangement, the support structure is made up of a number of rings 15a, axially aligned and retained in position by retaining means not illustrated in the drawing. However, other support structures may be provided, such as a single continuous tube.

In the illustrated arrangement, the support structure 15 is a solid, thermally-conductive, mechanical support, for example made of aluminum, with cooling channels 22 running circumferentially around the support. These channels may carry a cryogen in liquid and/or gaseous state, to provide cooling by a cooling loop arrangement. In alternative embodiments, a solid thermal conductor, such as a copper or aluminum strap or braid, may be provided, connecting the support structure 15 to a cryogenic refrigerator (not illustrated).

As is conventional in many types of superconducting magnet structure, the coils are enclosed within an outer vacuum chamber (OVC) 18, and thermal radiation shield 20 is interposed between the magnet structure and the OVC. A gradient coil assembly 30 is also illustrated. Solid thermal insulation, such as layers of aluminized polyester 25 may be provided in the space between the thermal shield 20 and the OVC 18.

According to this embodiment of the present invention, a 4K shield is provided by mounting a thermally conductive tube 24 onto the cold mass. In the illustrated embodiment, this is achieved using thermally conductive nuts, bolts and spacers. These provide mechanically rigid mounting points 26 and a degree of thermal conductivity between the tube 24 and the support structure 15. The 4K shield is completed by annular end pieces 28, which may be constructed of arcs of a thermally conductive material such as aluminum, welded, bolted or otherwise thermally and mechanically attached to the tube 24 and the support structure 15. The mounting points 26 may be provided at circumferential intervals around the tube, at a single axial distance d from each end of the coil support 15. Alternatively, further mounting points 26a may be provided at other distances axial distance d from each end of the coil support 15. The mounting points at various axial positions may be aligned at particular circumferential positions, or may be misaligned for reasons to be explained below.

As the mounting points need to resist motion of the tube 24, which is subjected to high-frequency cyclical forces, the mounting points must be constructed in such a way that they will not become loose as a result of those forces, and the resulting vibration of the tube. For example, joints between the mounting points 26, the tube 24 and the support structure 15 may be bolted and glued in the manner illustrated. Alternatively, such joints may be formed by welding, or a similar process such as brazing or soldering. Such joints are believed to be resistant to high-frequency low amplitude vibrations which they are likely to encounter in embodiments of the present invention. The various components involved, such as bolts, mounting points and tube 24 should be thermally matched, so that joints do not loosen due to differential thermal contraction of the various components.

The coils 10 are then substantially shielded from black-body radiation from the thermal shield 20. The electrical conductivity of the material of the 4K shield means that it will also shield the coils from magnetic fields generated by the gradient coils 30.

In operation, the 4K shield 24, 28 is kept at a nominal temperature of less than 5K, in this example. It is in thermal contact with the support structure 22 which is cooled to about 4K for instance by a cooling loop which causes cooled cryogen to circulate through channels 22. In an alternative arrangement, a conductor such as copper or aluminum straps or braids may be connected between support structure 15 and a cryogenic refrigerator or other surface cooled to about 4K, for example by liquid helium.

Figure 1B:
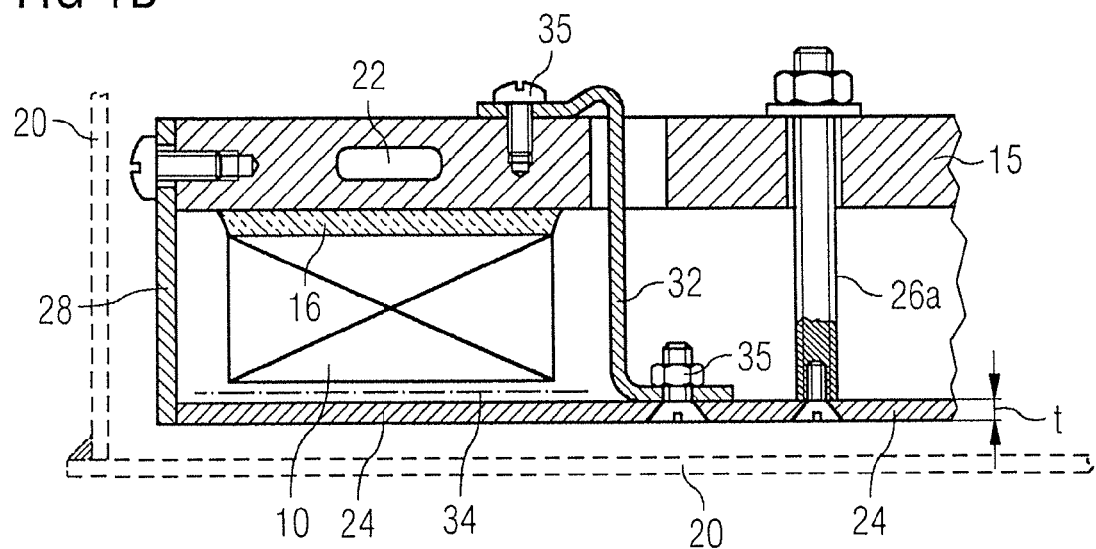

FIG. 1B shows a detailed part-axial cross section view of a variant of the arrangement of FIG. 1A. In this variant, a thermal link 32, for example a solid aluminum or copper strap, or a braid or laminate of aluminum or copper, is thermally connected between the tube 24 and the support structure 15 of the cold mass. Each end of the thermal link is connected at joint 35 in a thermally conductive manner to its respective component, for example by screws, nuts and bolts as illustrated. Other thermally conductive connecting means may be used, such as welding, brazing, soldering, clamping or crimping. Such joints 35 need to remain intact despite the motion of the tube 24, which is subjected to high-frequency cyclical forces, the joints must be constructed in such a way that they will not become loose as a result of those forces, and the resulting vibration of the tube. For example, the joints 35 may be bolted and glued in the manner illustrated. Alternatively, such joints may be formed by welding, or a similar process such as brazing or soldering. Such joints are believed to be resistant to high-frequency low amplitude vibrations which they are likely to encounter in embodiments of the present invention. The various components involved, such as bolts, support structure 15 and tube 24 should be thermally matched, so that joints do not loosen due to differential thermal contraction of the various components.

In such an arrangement, it is not necessary for the annular end piece 28 of the 4K shield to be in direct thermal or mechanical contact with the tube 24. Layers of solid insulation 34, such as aluminized polyester sheets, may be positioned between the coils 10 and the tube 24. This serves to reduce any black-body radiation from the tube 24 which reaches the coils 10.

Figure 1C:
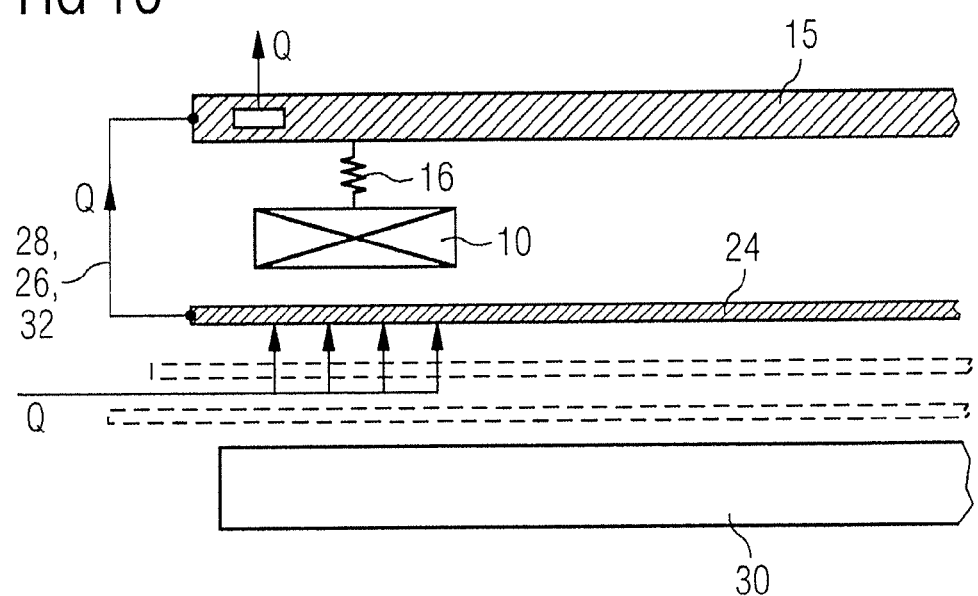

FIG. 1C shows a simple model of thermal conduction in a structure according to FIG. 1A or 1B. A thermal load Q, due to black body radiation and/or GCIH, is incident upon tube 24 of the 4K shield. The thermal load passes through thermally conductive path 28, 26, 32, which may be one or more of the thermal link 32, the annular end-piece 28 and the mounting points 26, to the support structure 15. The support structure is cooled by cooling channels 22, or an equivalent cooling method such as a solid conductor to a cryogenic refrigerator (not illustrated). The thermal load Q is accordingly removed from the structure by the cooling method.

In order to function as a suitable radiation shield, in addition to having sufficient thermal conductivity to carry away heat which reaches the 4K shield, tube 24 should also have a radially outer surface (i.e. the surface which faces the coils 10) with low emissivity. The low emissivity requirement may be achieved by suitable selection and preparation of the material of the thermal shield, but may alternatively be achieved by attaching a high reflectivity foil to the surface such as the aluminized polyester sheet 34 shown in FIG. 1B, or adhesive aluminum tape.

In order to function to shield stray magnetic fields, the tube 24 should have good electrical conductivity and a radial thickness t which is significantly larger than the skin depth of the magnetic field in the material of the tube. Preferably, the thickness t of the tube is at least twice the skin depth.

To provide effective magnetic and thermal shielding we require that the tube is 'stiff'. The resonant frequencies of the tube need to be higher than the operating frequencies of the gradient coils of the MRI scanner. A desirable feature of 4K shields using a tube 24 structure is that it is highly 'tunable' and some features which may enable this are shown in the drawings, and will be described below. Such features will reduce oscillation of the tube within the background magnetic field, and so will reduce the generation of secondary and tertiary eddy currents with the associated heating and noise.

Typically, gradient coils 30 are operated in clinical applications at frequencies in the range from 50 to about 3000 Hz. It is desirable that the vibration modes of the tube are at frequencies which are higher than 3000 Hz. Certain aspects of the present invention are dedicated to ensuring that this condition is met.

The resonance frequency of a tube with length L, average radius a, radial thickness t, density ρ, Young's modulus E, and Poisson ratio μ, radially clamped at an end is given by ("*Vibration of Shells and Plates*", Werner Soedel, eq. 6.12.3):

$$f = \frac{1}{2\pi a}\sqrt{\frac{E}{\rho}}\sqrt{1 + \frac{t/a}{12(1-\mu^2)}\left(\frac{m\pi a}{L}\right)^4}. \qquad 1$$

where m is the mode number.

In an example embodiment of the invention, the tube 24 may be an aluminum tube with a radius of 450 mm and a thickness t of 3 mm. The resonant frequencies for oscillation by circumferential expansion and contraction in the radial direction for different lengths of such tubes are shown in FIG. 3. FIG. 3 shows that oscillation by circumferential expansion and contraction at higher axial resonant modes remains at the fundamental frequency for a long tube, of 1400 mm, while oscillation at higher axial modes occurs at rapidly increasing frequencies for shorter tubes, in this case being particularly pronounced in the case of the shortest tubes of axial length 200 mm.

The typical length of the magnet is 1400 mm. FIG. 3 shows that the resonant frequencies do not vary significantly between the resonant modes. For shorter tube lengths, such as tube length less than 300 mm, there is a significant upward shift of the resonance frequencies for higher modes.

In the context of the present invention, then, it may be appreciated that the resonant frequency of the tube 24 may be increased by forming it out of several separately mounted short tubes, each of 200-300 mm length for example, rather than one long one of 1400 mm length.

Figure 1D:
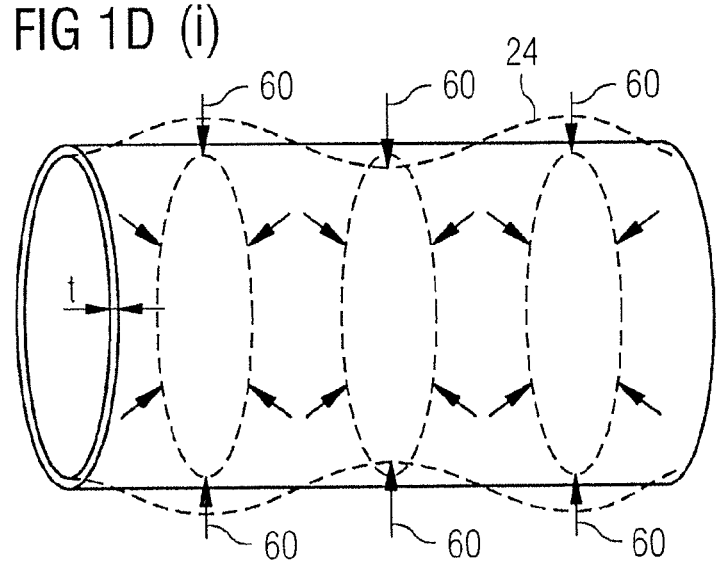
Figure 1D:
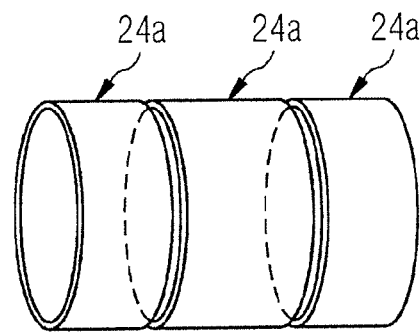

FIG. 1D(i) schematically illustrates the oscillation of a single tube 24. While the amplitude of such vibrations is exaggerated for clarity, it can be seen that the surface of the tube oscillates at antinodes 60. When this occurs in a background magnetic field, as with the magnet systems of the present invention, eddy currents and heating will be induced in the material of the tube.

FIG. 1D(ii) schematically illustrates the improved situation in which the tube 24 of the 4K shield is divided axially into multiple parts 24a. As discussed above, each of these shorter tubes will have higher resonant frequencies, and which suitable arrangements of mounting points may easily ensure do not resonate at frequencies of operation of the gradient coils of the imaging system.

The amplitude of oscillation is reduced in arrangements where the tube is divided axially. It is particularly important that the mounting points be resistant to loosening by vibration, by using glued bolts, welding or similar, and ensuring that any fixed components such as bolts are thermally matched to the adjacent fixed components.

Rather than providing a number of separate, separately mounted, short tubes 24a, much the same effect of increasing the resonant frequency is obtained by providing a radial constraint to the tube at similar intervals, at 200-300 mm axial intervals for example. Most simply, and referring to FIG. 1A, this may be achieved by providing a set of mounting points 26 spaced around the circumference of the tube 24 at axial intervals of 200-300 mm. As the tube is restrained every 200-300 mm, those parts of the tube between the sets of mounting points oscillate as a constrained tube of length 200-300 mm, and so the tube has a rather higher set of resonant frequencies than would be the case with a single tube running the length of the magnet. The same comments apply as in the preceding paragraph in relation to ensuring that the mounting points are resistant to loosening by vibration and/or differential thermal contraction of components.

Another way of increasing the resonant frequency of the tube would be to increase its thickness t, as can be seen from the above equation, but this will be at the expense of material and wire cost, since the diameter of the coils 10 would have to increase accordingly, to accommodate the increased thickness of the tube 24 without reducing the useful bore diameter.

A 3 mm thick aluminum tube has been found adequate to provide the required shielding. If the tube is made of a commercially "pure" grade of aluminum, such as is known as A]1200, the skin depth at 1000 Hz is 0.6 mm. This is a relatively cheap option and has significant manufacturing advantages. For a very pure grade of aluminum with a RRR (Residual Resistivity Ratio) of 1000, the skin depth at 1000 Hz is 0.1 mm. Such a material may be 99.999% pure, colloquially known as "five-nines" or 5N purity. The dissipation in the high purity aluminum will be significantly less, meaning that eddy currents in the tube will generate much less heat, although the magnitude of the eddy currents, and so the magnetic fields generated by them, will be rather greater.

Figure 1E:
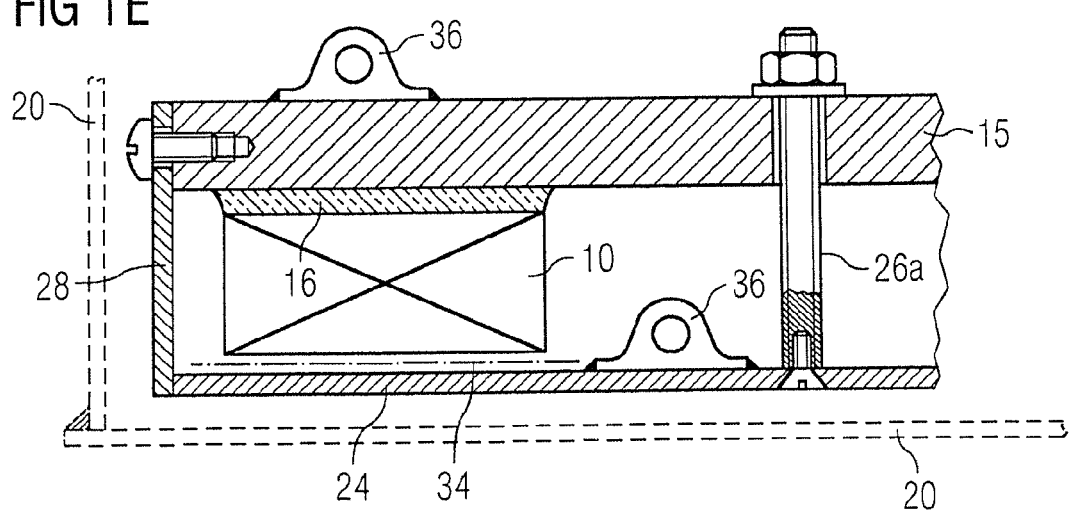

FIG. 1E shows another variant of the embodiment of FIG. 1A. In this arrangement, cryogen-filled cooling loops are provided by conductive omega-section tubes 36, thermally and mechanically attached to the tube 24 and the support structure 15, for example by welding, soldering or brazing. These serve to cool both the support structure 15 and the tube 24, reducing the need for thermal conduction between the tube 24 and the support structure 15. Separate cooling loops may be provided for the support structure 15 and the tube 24, or a single cooling loop may be provided, which includes both omega-section tubes 36 shown in FIG. 1E.

Figure 1F:
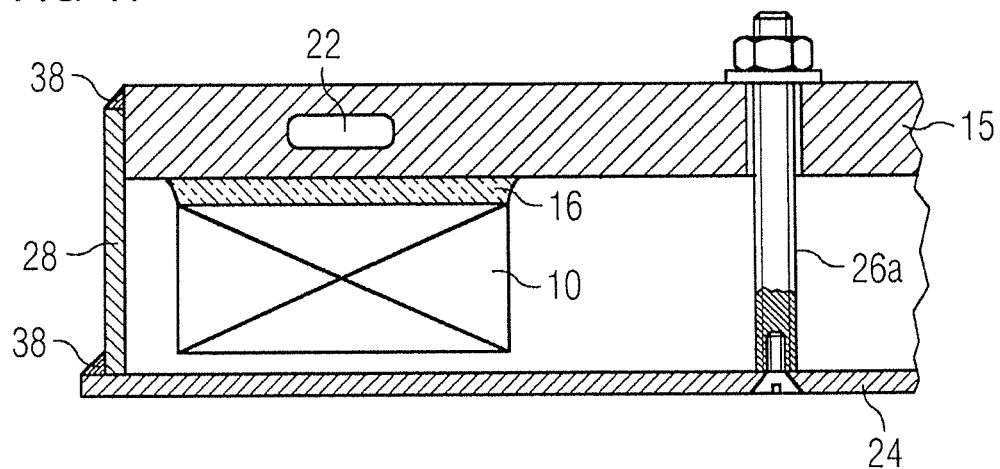

FIG. 1F illustrates a variant which may be employed in any of the above-described embodiments. In this variant, annular end piece 28 is welded 38 both to the support structure 15 and to the tube 24. In this variant, good thermal conduction is provided through the welds 38 and the annular end pieces 28.

Figure 1G:
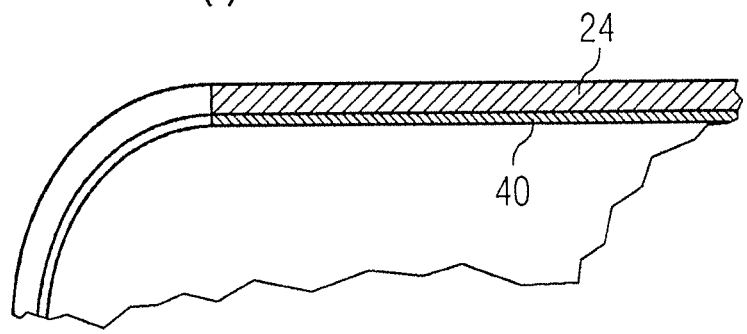
Figure 1G:
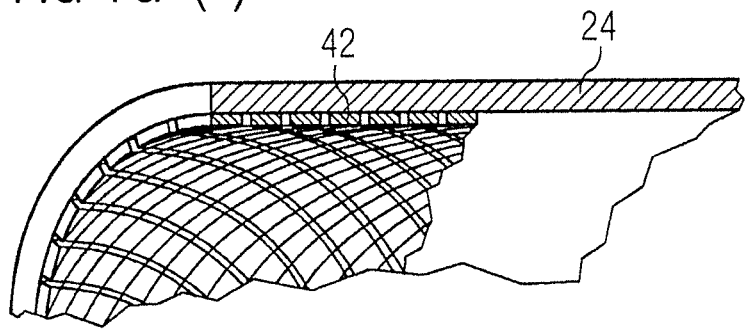

FIG. 1G(i) shows another embodiment of the invention, in which a tube 24 formed of a commercial grade of aluminum such as A]1200, as above, is clad with a layer 40 of very high (e.g. 5N) purity grade of aluminum. Because of the high cost of the high purity material, its thickness can be limited to about 0.5 mm due to the mechanical support provided by the tube 24 of commercial grade aluminum. Such a configuration has the advantage of limiting Lorentz forces and stresses during a quench, due to the high conductivity of the 5N cladding and the structural strength of the commercial grade tube.

FIG. 1G(ii) shows another embodiment of the invention, in which a tube 24 formed of a commercial grade of aluminum such as A]1200, as above, is clad with lengths of superconducting wire 42 in a basket-weave arrangement. As the tube 24 will be cooled to below the transition temperature of the superconducting wire, then the wire 42 forms a layer of very low electrical resistance to exclude stray gradient-coil generated magnetic flux from the vicinity of the coils, but also resists the generation of large eddy currents as the structure will have appreciable electrical resistance in closed electrical paths.

Figure 2A:
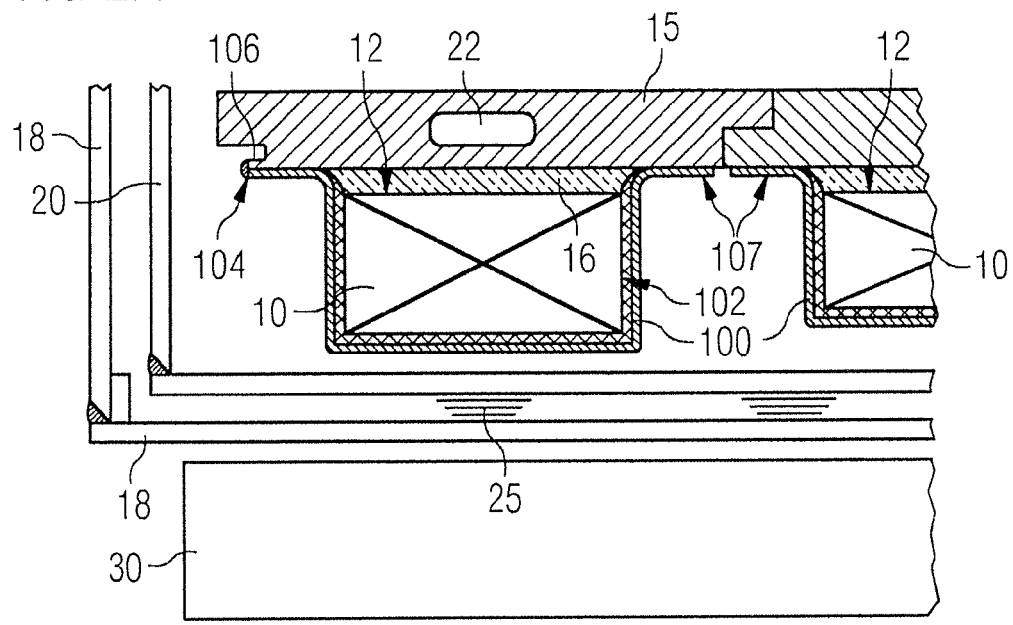
FIGS. 2A to 2C(ii) show several views of another series of embodiments of the present invention.
Figure 2B:
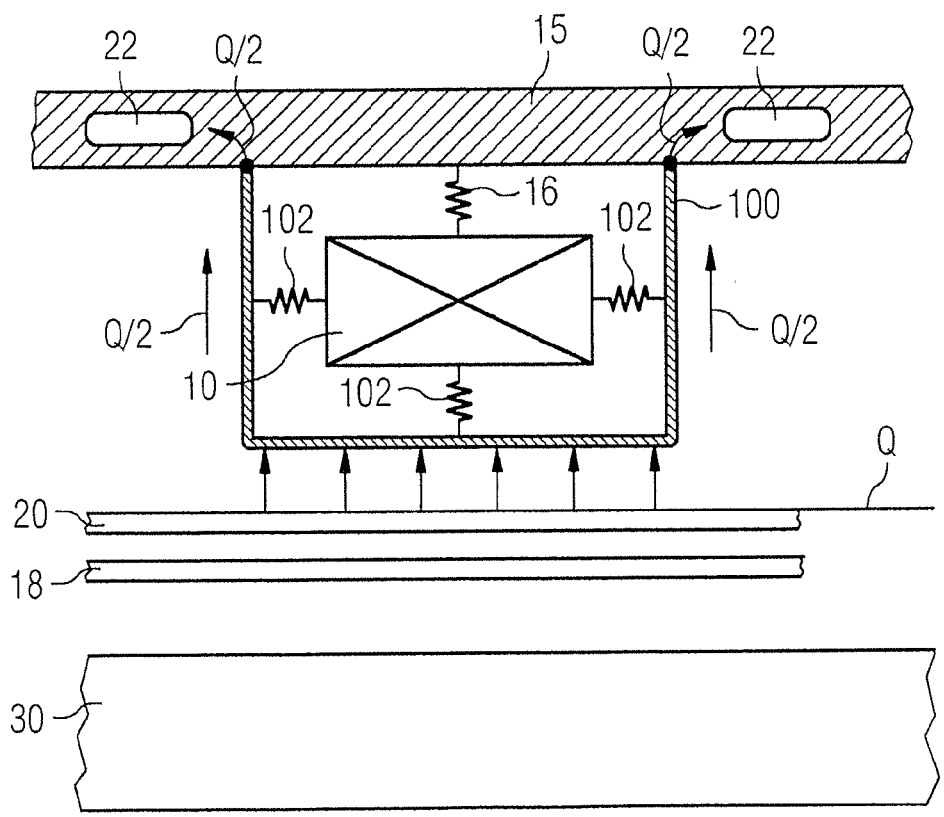
Figure 2C:
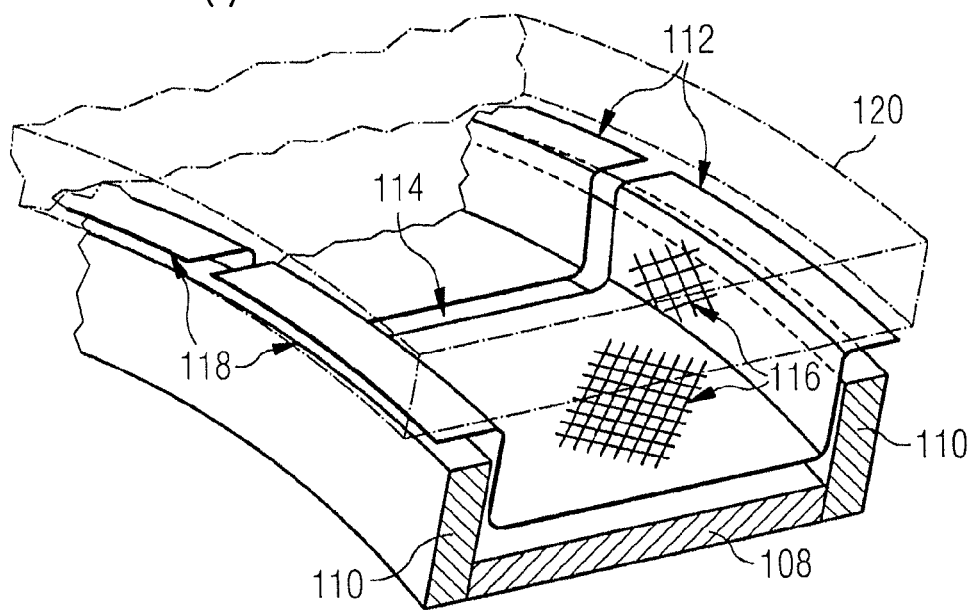
Figure 2C:
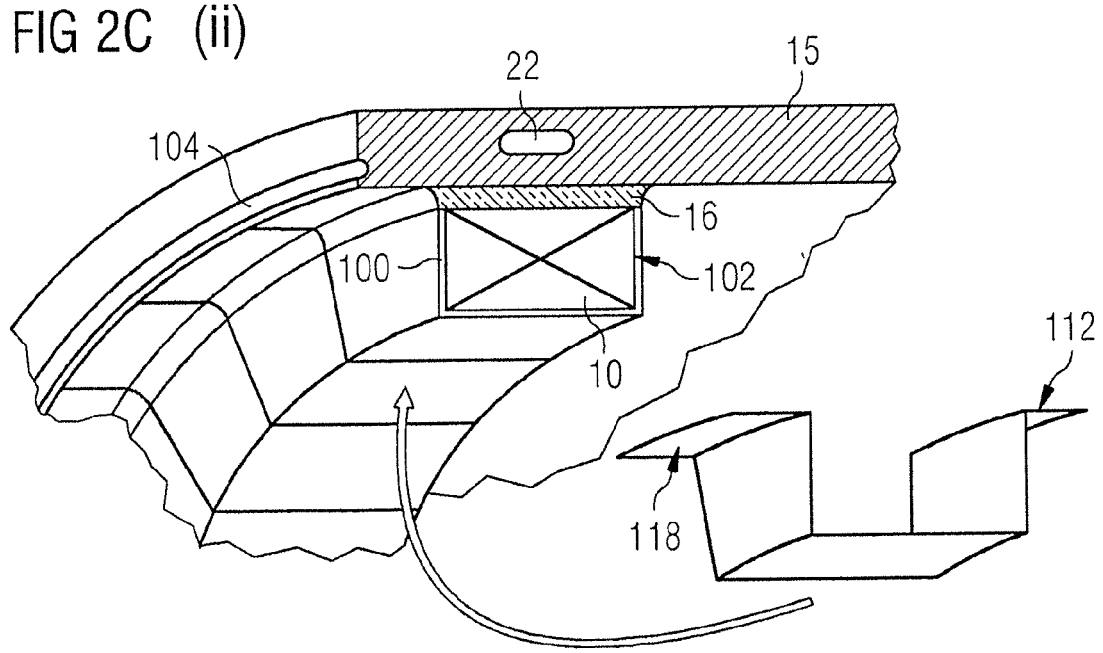

FIGS. 2A-2C(ii) illustrate a further series of embodiments of the invention, which include a 4K shield in the form of a conductive cladding bonded or otherwise fixed directly to the magnet coils.

As shown in FIG. 2A, this embodiment resembles that of FIG. 1A at least in that it includes coils 10 bonded on their radially outer surfaces 12 to a support structure 15 containing cooling channels 22. As illustrated, an optional electrically isolating layer 16 is provided between the radially outer surface of the coils and the mechanical support structure 15. The OVC 18, thermal shield 20 and gradient coil assembly 30 are as described above.

According to this embodiment of the invention, a closely-coupled 4K shield 100 is provided, in mechanical contact with each coil 10. The closely-coupled 4K shield may be manufactured from high-purity aluminum foil, or a superconducting foil. It is preferably electrically and thermally isolated from the associated coil 10 by an electrically and thermally insulating layer 102, for example of resin-impregnated glass fiber cloth.

This embodiment has the advantage of using a much thinner 4K shield 100, which occupies much less space than the 4K shield of FIGS. 1A-1G(ii) and has a much higher resonant frequency by virtue of being directly connected to the mechanically stiff cold mass 10, 15.

As the thermal impedance between the shield 100 and coils 10 will necessarily be lower in the embodiment of FIG. 2A than in the embodiment of FIG. 1A, the dissipation in the shield must be reduced to a very low level to prevent unacceptable heating of the coils which are in close proximity. The required low dissipation may be achieved by ensuring that the close-coupled 4K shield has a low electrical resistivity. This may be achieved by forming the close-coupled 4K shield of high purity aluminum cladding (e.g. having a RRR>1500 at zero field); or of a superconducting material such as NbTi foil.

FIG. 2A more specifically illustrates an embodiment in which the close-coupled 4K shield 100, formed as a cladding over each coil, is welded 104 to the support structure 15, which is preferably made of aluminum, like the 4K shield. It may be found difficult to weld a superconducting material to the support structure. As illustrated, it may be found beneficial to form a lip 106 in the material of the support structure, to assist in the welding step.

As shown in FIG. 2A, one edge of the close-coupled 4K shield may be welded 104 to the support structure, while the other edge 107 may be attached by an adhesive. For example, various resin adhesives sold by Emerson and Cuming under the STYCAST brand may be found suitable. The primary thermal path from the 4K shield 100 to the support structure 15 will be through the weld 104, having lower thermal impedance than the adhesive joints at the other end 107. Nevertheless, the greater surface area and tolerable thermal impedance of the adhesive joint at 107 means that a useful degree of thermal conduction also takes place through the adhesive joints. The electrically isolating layers 16, 102 should withstand voltages of 5 kV or more, to ensure that the electrical isolation does not break down in the case of a quench.

FIG. 2B illustrates a simple thermal model of the structure of FIG. 2A. The electrically isolating layers 16, 102 are represented as thermal impedances. As illustrated, a thermal load Q is provided by black body radiation from thermal shield 20 towards coils 10. This thermal load is intercepted by the close-coupled 4K shield 100. In the illustrated model, it is assumed that both edges of the close-coupled 4K shield are attached to the support structure 15 with equal thermal conductivity, and that the edges are joined to the support structure at equal distances from cooling channels 22 of equal temperature. In these conditions, the thermal load Q will divide equally between the two radially-directed parts of the close coupled 4K shield 100, and a thermal load of Q/2 will flow along each, as shown in FIG. 2B.

FIG. 2C(i) shows an intermediate stage in a method of manufacturing a structure as shown in FIG. 2A. As is conventional in the formation of resin-impregnated coils, a mold is formed of a journal surface 108 and two annular retaining plates 110. Pressed channel pieces 112 of high-purity aluminum or superconducting foil are positioned inside the mold, at least substantially covering the interior surfaces of the mold formed by the journal surface 108 and the annular retaining plates 110. An axially-extending gap 114 may be left between adjacent channel pieces 112, or at least some of them. Such gaps will reduce eddy currents during ramping and quench, but will allow some thermal load to reach the coils. In an alternative arrangement, neighboring channel pieces 112 may be positioned to overlap, with an electrically isolating layer placed between them to prevent electrical conduction between one channel piece and the next. A layer of porous electrically insulating material 116, such as glass fiber cloth, is provided over the inner surfaces of the channel pieces 112.

With the mold prepared in this way, a coil is wound into the mold in the conventional manner. Once winding of the coil is complete, a radially outer part of the mold, shown in phantom at 120 is positioned over the coils to complete the mold cavity. As is conventional, a crust layer of glass cloth may be wound over the coil, within the mold cavity or a crust layer of glass beads may be provided within the mold cavity, between the radially outer surface of the coil and the radially inner surface of the radially outer part 120 of the mold. The coil, the electrically insulating layer 116 and the crust layer 16 are then impregnated with resin which is cured, as is conventional. The electrically insulating layer 116 becomes electrically isolating layer 102 as shown in FIG. 2A. In arrangements such as shown in FIG. 2A, the radially outer part of the mold 120 may be a section of the support structure. In this case, the radially inner surface of the radially outer part 120 of the mold may be treated to provide a good bond between the section of the support structure and the resin of the coil. In other arrangements, radially inner surface of the radially outer part 120 of the mold may be treated with a release compound to ensure that it does not bond to the resin of the coil, and the resin impregnated coil so formed may then be bonded to another support structure in a separate bonding step.

Preferably, and as illustrated in FIG. 2C(i), one edge 118 of each channel piece 112 protrudes from the mold, and remains above the level of the resin during the impregnation step. This ensures that those edges remain clean, so that they may easily be welded, as shown at 104 in FIG. 2A.

The method described with reference to FIG. 2C(i) may be referred to as a "single step" process, as the coils are formed, impregnated and provided with a close-coupled 4K shield 100 all in the same processing step.

In contrast, FIG. 2C(ii) shows an intermediate stage in a "two-step" method of manufacturing a structure as shown in FIG. 2A. In this method, coils 10 are wound, impregnated and bonded to support structure 15 by any convenient, conventional method. For example, the coil may be wound into a mold similar to that shown in FIG. 2C(i) and bonded to support structure 15 during the impregnation step, or may be impregnated separately and bonded to the support structure in a separate step. An electrically isolating layer, as at 116 in FIG. 2C(i), may be applied to the coils during the winding and impregnations step. Alternatively, no such layer may be applied at that stage.

In the second step of this method, channel pieces 112 are affixed to cover the axial and radially inner surfaces of the coils 10. This may be achieved by applying a layer of epoxy resin adhesive, for example any of various resin adhesives sold by Emerson and Cuming under the STYCAST brand may be found suitable. Alternatively, and if no electrically isolating layer is provided on the coil during the winding and impregnation step, the inner surfaces of the channel pieces 112 may be covered with an uncured resin-impregnated electrically isolating layer 116 such as glass fiber cloth. The channel pieces 112 are then applied to the coil, and the resin-impregnated electrically isolating layer 116 cured, to bond the channel pieces 112 onto the coils.

As in the embodiment of FIG. 2C(i), edges 118 should be kept free of resin, so as not to interfere with a welding step 104. As in other embodiments, the conductive channel pieces 112 may be welded or adhesively bonded to the support structure 15.

The channel pieces are preferably of high purity aluminum, such as 5N purity aluminum, as discussed above, or superconducting foil such as NbTi foil. Other materials may be used, but high purity aluminum is presently found to be easily available, relatively cheap and highly conductive.

In all cases, it is imperative that robust electrical insulation, and significant thermal insulation, 102, is placed between the coils 10 and the channel pieces 112 forming the 4K shield, to prevent electrical breakdown during a quench, and to limit the amount of heat transferred to the coils 10 through the thermal resistance of isolating layer 102. It is also desirable to include breaks 114 between channel pieces 112 to prevent excessive eddy current heating of the 4K shield 100 during ramping of the magnet.

The present invention accordingly provides a 4K shield useful in reducing the risk of gradient coil interaction, either by induced heating or stray magnetic fields, which might cause quenching in the superconducting coils of dry or minimum-cryogen magnet systems. The shield also serves to reduce gradient coil induced heating GCIH at 4K in such a magnet system.

In one group of embodiments, the 4K shield comprises a cooled tube spaced away from the coils but mounted to the cold mass in such a way as to present less impedance to heat flow from the 4K shield to the cooling arrangement than the route through the coils themselves. The shield supports may be arranged such that the main resonant frequencies of the 4K shield are higher than those excited during imaging. In one embodiment, the 4K shield is faced with high conductivity material to minimize the heat-load to the cooling system. Particular advantages of this embodiment are ease of manufacture, ease of achieving the required electrical insulation integrity, good thermal separation between the coil and shield and very good scope for dynamic tuning of the shield system.

In another group of embodiments, the coils are provided with cooled high conductivity cladding, closely mechanically coupled to the coils. These embodiments take up less radial space and readily achieve the requirement of high resonant frequency (>3000 Hz) by virtue of being fixed to the stiff cold-mass. The main challenge of such arrangements is to minimize the heat conducted to the coil from the closely coupled shield. This may be achieved by the use of high conductivity materials and careful choice of the insulating layer between the coils and cladding.

The first group of embodiments, using a cooled tube, has the advantages of manufacturing ease and the relative ease of achieving the required 5 kV voltage isolation The 4K shields provided by the present invention provide black-body radiation shielding for the coils, and provide magnetic shielding for the coils such that the coil temperature increase due to GCIH remains below the threshold which would make the magnet quench. These objectives may be achieved, according to the present invention, with minimum dissipation of heat in the cooled components and in a manner that is easy to manufacture, that can be implemented in the minimum possible radial space and that achieves the required voltage isolation between the magnet coils and ground potential.

Although modifications and changes may be suggested by those skilled in the art, it is the intention of the inventors to embody within the patent warranted heron all changes and modifications as reasonably and properly come within the scope of their contribution to the art.

We claim:

1. A cylindrical superconducting magnet structure, comprising:

a plurality of resin-impregnated, axially aligned annular coils of superconducting wire, each coil having an axis around which the coil is wound, and a radially outer surface and a radially inner surface;

a tubular support structure at least partially surrounding the respective radially outer surfaces of said annular coils and having a larger diameter than said radially outer surfaces, each of said annular coils exhibiting a thermal resistance between the respective annular coil and the tubular support structure;

a cooling arrangement in thermal communication with said tubular support structure that cools at least said tubular support structure to a cryogenic temperature; and a cryogenic radiation shield between the respective radially inner surfaces of the annular coil and the respective axes of the annular coils, said cryogenic radiation shield comprising a conformal layer of metal foil applied over the radially inner surface of each of said annular coils, and an electrically and thermally insulating layer interposed between each of said annular coils and said metal foil layer, and wherein said conformal layer of metal foil is also applied over axially facing surfaces of each of said annular coils, with said electrically and thermally insulating layer also interposed between each annular facing surface of each coil and said metal foil layer, with a thermal resistance between each metal foil layer and said tubular support structure being less than the thermal resistance between the respective annular coils and the tubular support structure.

2. A cylindrical superconducting magnet structure as claimed in claim 1 wherein said layer of metal foil comprises gaps in electrical conductivity of said layer of metal foil.

3. A cylindrical superconducting magnet structure as claimed in claim 2 wherein said gaps proceed in a direction parallel to the respective axes of the annular coils and thereby restrict circumferential electrical conductivity of said layer of metal foil.

4. A cylindrical superconducting magnet structure as claimed in claim 1 wherein said cryogenic radiation shield comprises two edges, not covered by said metal foil layer, that face said tubular support structure, with a first of said two edges being connected to said tubular support structure by a first connection and a second of said two edges being connected to said tubular support structure by a second connection, said first connection having a lower thermal impedance than said second connection and thereby forming a primary thermal path between said cryogenic radiation shield and said tubular support structure.

5. A cylindrical superconducting magnet structure as claimed in claim 4 wherein said first connection is a weld and said second connection is an adhesive.

6. A cylindrical superconducting magnet structure as claimed in claim 1 wherein said metal foil is selected from the group consisting of high-purity aluminum foil and superconducting foil.

7. A cylindrical superconducting magnet structure as claimed in claim 1 wherein said thermally insulating layer is a resin-impregnated glass fiber cloth.

* * * * *